(12) United States Patent
Küsel

(10) Patent No.: US 7,237,213 B2
(45) Date of Patent: Jun. 26, 2007

(54) PROCESS AND DEVICE FOR TIMING ANALYSIS OF A CIRCUIT

(75) Inventor: Andreas Küsel, Munich (DE)

(73) Assignee: Infineon Technologies AG (DE)

( * ) Notice: Subject to any disclaimer, the term of this patent is extended or adjusted under 35 U.S.C. 154(b) by 232 days.

(21) Appl. No.: 10/996,344

(22) Filed: Nov. 23, 2004

(65) Prior Publication Data

US 2005/0114810 A1 May 26, 2005

(30) Foreign Application Priority Data

Nov. 26, 2003 (DE) ................ 103 55 187

(51) Int. Cl.
*G06F 17/50* (2006.01)
(52) U.S. Cl. .................. 716/6; 716/4; 716/5
(58) Field of Classification Search ........... 716/4–6
See application file for complete search history.

(56) References Cited

U.S. PATENT DOCUMENTS

| | | | | |
|---|---|---|---|---|
| 4,841,178 | A * | 6/1989 | Bisson | 327/19 |
| 5,313,470 | A * | 5/1994 | Simpson | 714/727 |
| 5,345,453 | A * | 9/1994 | Bayer et al. | 714/820 |
| 5,452,239 | A * | 9/1995 | Dai et al. | 703/19 |
| 5,812,561 | A * | 9/1998 | Giles et al. | 714/726 |
| 5,943,490 | A * | 8/1999 | Sample | 703/28 |
| 6,083,273 | A | 7/2000 | Takeuchi | |
| 6,145,105 | A * | 11/2000 | Nadeau-Dostie et al. | 714/726 |
| 6,240,152 | B1 * | 5/2001 | Ho | 375/376 |
| 6,408,265 | B1 * | 6/2002 | Schultz et al. | 703/22 |
| 6,694,464 | B1 * | 2/2004 | Quayle et al. | 714/725 |
| 6,763,489 | B2 * | 7/2004 | Nadeau-Dostie et al. | 714/731 |
| 7,051,294 | B2 * | 5/2006 | Masleid | 716/1 |
| 7,062,736 | B2 * | 6/2006 | Oleksinski et al. | 716/6 |
| 7,082,584 | B2 * | 7/2006 | Lahner et al. | 716/4 |

FOREIGN PATENT DOCUMENTS

JP  09081616 A  3/1997

OTHER PUBLICATIONS

G. Arrigoni et al., *"False Path Elimination in Quasi-Static Scheduling"*, 7 pgs., Proceedings of the 2002 Design, Automation and Test in Europe Conference and Exhibition, IEEE 2002.

* cited by examiner

*Primary Examiner*—Jack Chiang
*Assistant Examiner*—Naum B Levin
(74) *Attorney, Agent, or Firm*—Brinks Hofer Gilson & Lione

(57) ABSTRACT

Circuit elements are operated as a function of a state of at least one change-over signal, in each case with a particular respective clock mode. Timing analysis is carried out by means of a description of the circuit. The description contains information as to whether the change-over signal is a quasi-static signal which does not change during operation of the circuit, and the descriptions for the circuit elements each contain information as to the state of the change-over signal with which the respective circuit element is operated in which clock mode. In the course of the timing analysis of a timing path which contains the circuit elements, the analysis unit checks whether the change-over signal is a quasi-static signal, and, if so, combinations of respective particular clock modes of the circuit elements that presuppose different states of the change-over signal are not taken into account.

18 Claims, 1 Drawing Sheet

PROCESS AND DEVICE FOR TIMING ANALYSIS OF A CIRCUIT

This application claims the benefit of priority to German Patent Application DE 103 55 187.5, filed on Nov. 26, 2003, incorporated herein by reference.

FIELD

The present invention relates to a process and to a device for timing analysis of a circuit. It relates, in particular, to a process and to a device with which existing processes and devices for timing analysis, in particular for static timing analysis (STA), are upgraded.

BACKGROUND

Timing analysis plays an important role in the design of circuits. In the course of timing analysis, a check is made, for example, as to whether a signal is available on time and for long enough in order to be sampled in a controlled manner by a rising edge of a clock signal (so-called setup-and-hold response). Signal propagation times within a circuit can also be analyzed here.

The embedding of timing analysis into the process of development of a circuit is represented schematically in FIG. 1. The circuit is present to begin with in the form of a description at register level, e.g. in the form of RTL (register transfer level) description A. This RTL description A is converted by a synthesizer 1 into a description at gate level (gate-level description) B which, for example, may be available in VHDL (Very High Speed Integrated Circuit Hardware Description Language) or Verilog. This description B is supplied to an analysis unit 4 which carries out the timing analysis—that is to say, which analyses the timing of the circuit described by the description at gate level B. Restrictions E arising therefrom are supplied in turn to the synthesizer 1, so that the restrictions can be used for an optimization of the description at gate level B. The description at gate level B that has been optimized in this way is processed by a layout device 2, in order to obtain a layout description C. This layout description C is supplied in turn to the analysis unit 4. In particular, layout-conditioned signal propagation times or clock propagation times can be analyzed in this manner. Restrictions F arising from this, which may relate, for example, to lengths of signal paths, are supplied in turn to the layout device 2. Once the layout C has been optimized in this way, it is accepted by a unit 3 and made available for further processing in the form of description D of the circuit.

The various devices 1 to 4 here are ordinarily implemented as software in data-processing equipment. A widespread type of software for static timing analysis is, for example, the program package PrimeTime® from Synopsis®.

However, these timing analysis tools are able to process only one timing case or timing mode at a time. Real circuit designs always have various timing modes or operating modes, for example a normal operating mode and a test mode in which a circuit can be tested after production. In the test mode, phase-locked loops, for example, are bridged, and all the flip-flops or latches of the circuit are clocked with the same clock signal. In the normal operating mode, on the other hand, the clock frequencies are generally significantly higher, and various areas of the circuit are operated with various clock signals.

In the course of a process for circuit design, in general both operating modes are checked separately within the scope of the timing analysis.

Timing-analysis algorithms are also frequently integrated within the layout device 2 from FIG. 1, in order to take the timing of the circuit directly into account in the layout. Here at least, various operating modes have to be taken into account in parallel, in order not to violate timing requirements of another operating mode by an optimization of one operating mode.

Control signals ordinarily serve for changing over between the operating modes. These control signals do not change during operation of the circuit and may therefore be designated as quasi-static. These signals change over various circuit elements of the circuit between various clock modes, for example between various clock signals that are being used.

This will be elucidated on the basis of a simple circuit which is represented in FIG. 2. This circuit consists of three flip-flops 5, 6, 7 which each have a data input D, an output Q, an inverted output $\overline{Q}$ and a clock input, identified by a triangle. A data signal m is supplied to flip-flop 5. The output Q of flip-flop 5 is connected to the input D of flip-flop 6 via a path 8; the output Q of flip-flop 6 is connected to the input D of flip-flop 7 via a path 9.

Two different clock signals h and k are supplied to the circuit. By means of a change-over switch or a multiplexer 10, either the clock signal h or the clock signal k is supplied to flip-flops 5 and 6, depending on a change-over signal g. The clock signal k is always supplied to flip-flop 7. For example, k may be a clock signal that is used only in a test mode, whereas both signal h and signal k are used in normal operation of the circuit.

In this circuit, two timing paths—namely timing path 8 from flip-flop 5 to flip-flop 6 and timing path 9 from flip-flop 6 to flip-flop 7—have to be analyzed. In principle, with such a circuit it would be possible for the change-over signal g to change over from one clock-pulse period to the next. This could have the result, for example, that at the output of flip-flop 5 a signal generated with clock signal h is output which, after the change-over of the change-over signal g, is then processed further with clock signal k in flip-flop 6.

However, if the change-over signal g is a quasi-static signal which switches between various operating modes of the circuit but which is not changed itself during operation of the circuit, this case cannot occur. This case must accordingly be excluded in the course of the timing analysis, in order that no error messages are generated here or no false optimization is performed. Hitherto this has been defined by definition of so-called "false paths" between all the affected circuit elements downstream of the change-over switch 10. A typical syntax with which a program for timing analysis would be instructed to carry out the timing analysis for this circuit would look as follows:

```
create_clock-period 22.4-waveform {0 11.2}
    [get_ports{CLK1}]

create_clock-period 11.2-waveform {0 5.6}
    [get_ports{CLK2}]

create_generated_clock-name "CS_high"-source
    [get_ports{CLK1}][get_pins {Mux1/Z}]

create_generated_clock-name "CS_low"-source
    [get_ports{CLK2}][get_pins }Mux1/Z}]-add set_false_path-from [get_clocks{CS_high)}]to
    [get_clocks{CS_low}]
``` set_false_path-from [get_clocks{CS_low}]to
[get_clocks{CS_high}]

In the first two lines, the two clock signals h, k are defined as CLK1 and CLK2 with different waveforms and clock-pulse periods. In the next two lines, two auxiliary clock signals CS_high and CS_low are defined, with which the dependence of the output of the change-over switch 10 on the change-over signal g, which does not itself appear in the description, can be established. In the last two lines, the false paths are finally defined, by virtue of which it is to be ruled out that timing paths in which, for example, flip-flop 5 is driven with clock signal h and flip-flop 6 is driven with clock signal k are considered in the timing analysis.

In the case of the relatively simple circuits represented in FIG. 2, such false paths are still relatively easy to define. However, here the change-over switch 10 and the quasi-static signal g associated with it already have to be known especially, in order to be able to define the false paths appropriately. For larger circuits—which comprise a plurality of change-over switches, several quasi-static change-over signals and a plurality of circuit elements downstream of the change-over switches—a very precise knowledge of the circuit and a great deal of time are necessary to define the false paths correctly.

SUMMARY

A process and a device are presented in which the definition of false paths for the case of quasi-static signals is not necessary, and the time required for setting up timing analysis of a circuit is reduced.

By way of introduction only, in one embodiment, a method for the timing analysis of a circuit is presented. The circuit contains interconnected first and second circuit elements, which are each operated with a particular respective clock mode as a function of a state of a change-over signal. The timing analysis is carried out using a description of the circuit. The description contains information as to whether the change-over signal is a quasi-static signal which does not change during operation of the circuit. Descriptions for the first and second circuit elements each contain information as to the state of the change-over signal with which the respective circuit element is operated in which clock mode. In the course of the timing analysis of a timing path that comprises the first circuit element and the second circuit element, a check is then made as to whether the change-over signal is a quasi-static signal, and, if the change-over signal is a quasi-static signal, combinations of respective particular clock modes of the first and second circuit elements that presuppose different states of the change-over signal are disregarded in the timing analysis of the timing path.

Information is provided in the description of the circuit that enables false paths not to be taken into account from the start. Accordingly, it is no longer necessary to identify false paths at a preliminary stage and to select them and to define them specially.

The first circuit element and/or the second circuit element may comprise, in particular, a flip-flop or a latch. The respective particular clock mode may specify a clock signal with which the respective circuit element is operated. The change-over signal may serve for changing over the circuit between a test mode and a normal operating mode.

The change-over signal may comprise first and second change-over signals. In this case, the description contains information as to which combinations of states of the first and second change-over signals may arise in the course of operation of the circuit. In the timing analysis of the timing path, combinations of respective particular clock modes of the first and second circuit elements that result only in the case of combinations of states of the first and second change-over signals that cannot arise are then disregarded.

This is particularly expedient in the case of large circuits in which not only a single change-over signal is available.

The method may be used as an upgrade or improvement of existing tools for timing analysis or as an upgrade or improvement for a method for laying out a circuit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate various embodiments and together with the description serve to describe the embodiments.

DETAILED DESCRIPTION

Figure 2:
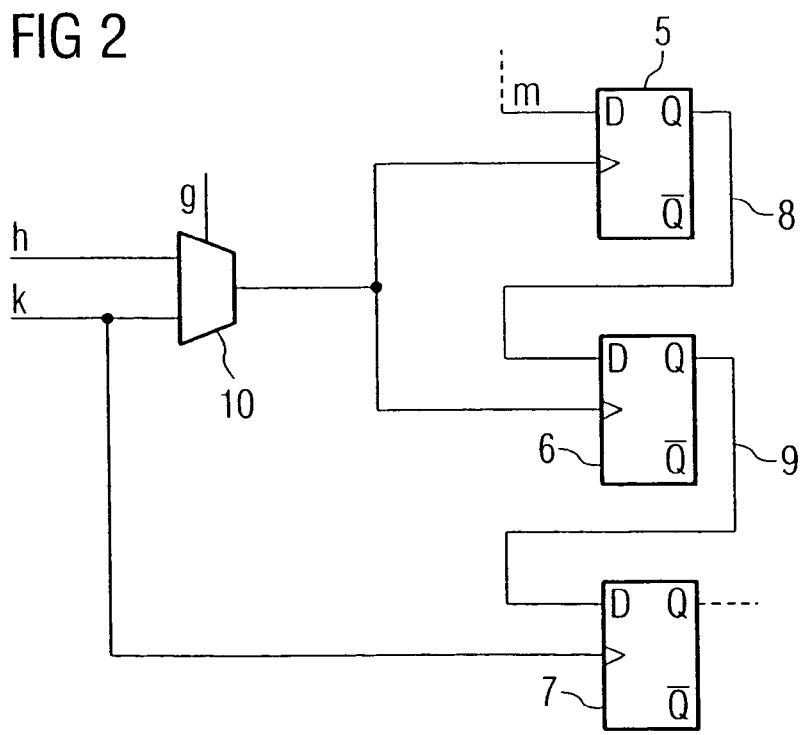
FIG. 2 is a circuit for elucidating the process according to the invention.

Reference is made once again to the circuit of FIG. 2 which was already described in the introduction to the description. This circuit comprises three flip-flops 5, 6, 7, each with a data input D, a data output Q, an inverted data output $\overline{Q}$ and a clock input identified by a triangle. Flip-flop 5 is connected to flip-flop 6 via a path 8; flip-flop 6 is connected to flip-flop 7 by a path 9. A first clock signal h and a second clock signal k are supplied to the circuit. A change-over switch or multiplexer 10 is driven by a change-over signal g. For example, in the case of a value 1 of the change-over signal g the first clock signal h is supplied to flip-flop 5 and to flip-flop 6; in the case of a value of the change-over signal g of 0, the second clock signal k is supplied to flip-flop 5 and to flip-flop 6. Furthermore, the second clock signal k is supplied to flip-flop 7.

For the timing analysis of the circuit, use is made, for example, of a VHDL description or Verilog description of the circuit. In the present example the change-over signal g is now to be a quasi-static signal with which, for example, changing over between a test mode and a normal operating mode can be effected but which does not change during operation of the circuit.

Information is included in the description of the circuit stating that the change-over signal g is such a quasi-static signal. Furthermore, information is included in the description stating that flip-flop 5 and flip-flop 6 are operated with the first clock signal h in the case of a value 1 of the quasi-static change-over signal g and are operated with the second clock signal k in the case of a value 0 of the quasi-static change-over signal g. Depending on the description that is being used, this latter information may also already be available in the description and may then also be used for the process herein.

Figure 1:
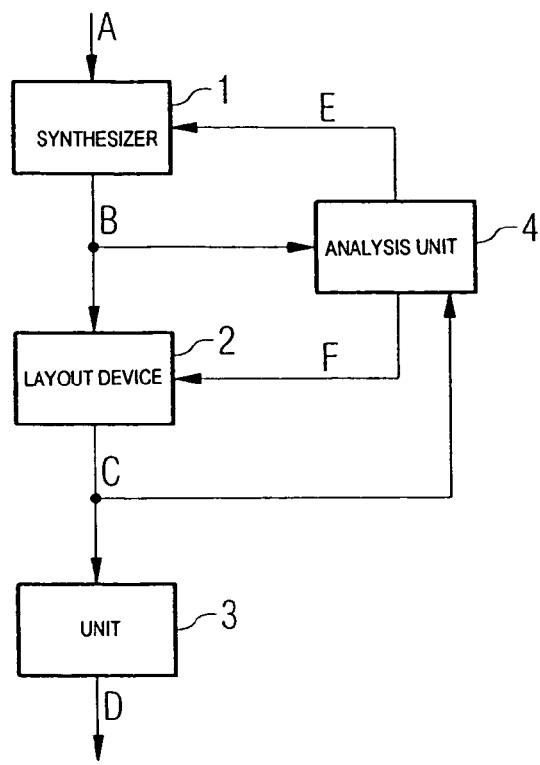
FIG. 1 is an illustration of an embedding of a device according to the invention in a process for chip design.

This means that in FIG. 1, description B or description C contains this information. This description is supplied to analysis unit 4. This analysis unit 4 analyses the description and checks firstly whether the change-over signal g is a quasi-static signal. If this is the case, as in the present example, then on the basis of the information that is available with respect to flip-flops 5 and 6 as to which clock signal is supplied for which value of the quasi-static signal the timing path 8 in which flip-flop 5 is operated with the first clock signal h and flip-flop 6 is operated with the second clock signal k and also the timing path 8 in which the first flip-flop 5 is operated with the second clock signal k and the second flip-flop 6 is operated with the clock signal h are no longer taken into account, i.e. are disregarded.

Accordingly, in the course of the timing analysis only the following paths are processed:

1. Path 8: flip-flop 5 and flip-flop 6 are both operated with the first clock signal h;
2. Path 8: flip-flop 5 and flip-flop 6 are both operated with the second clock signal k;
3. Path 9: flip-flop 6 is operated with the first clock signal h, flip-flop 7 is operated with the second clock signal k;
4. Path 9: flip-flop 6 and flip-flop 7 are both operated with the second clock signal k.

The definition of false paths is consequently superfluous, which in the case of circuits larger than the one represented here in exemplary manner may represent a considerable simplification and saving of time. In addition, the probability that unnecessary false paths are defined or that false paths are missing is reduced, which in appropriate circumstances may result in a better circuit design with respect to current consumption and the area needed.

In the example represented in FIG. 2, use is made of a change-over signal g in order to change over between two operating modes of the circuit. In larger and more complex circuits it may happen, for example, that switching-over between a maximum of four operating modes can be effected by means of two change-over signals g1 and g2, as the table below shows:

TABLE 1

|  | g1 = 0 | g1 = 1 |
| --- | --- | --- |
| g2 = 0 | operating mode 1 | operating mode 2 |
| g2 = 1 | operating mode 3 | operating mode 4 |

In this connection, each of the change-over signals g1, g2 controls, for example, a change-over switch for a part of the circuit being considered. In addition, it may be, for example, that the circuit is operated only in operating modes 1 to 3 but never in operating mode 4.

This may also be recorded in description B or C of the circuit, for example in the form of Boolean equations or in the form of a table. The analysis unit 4 is then configured such that it reads this information, and timing paths that would presuppose an operating mode that is not provided, in the present example g1=1 and g2=1, are disregarded. This concept may, of course, be extended to more than two change-over signals.

The process that has been presented and the device that has been presented are, of course, not limited to simple circuits like that represented in FIG. 2. Rather, this circuit was cited merely for the purpose of illustration. The process shows its strength, in particular, when the circuit becomes too large and too intricate to be able to define false paths in straightforward manner. In particular, in the case of such a more complex circuit a timing path to be analyzed may also comprise more than two circuit elements.

It is therefore intended that the foregoing detailed description be regarded as illustrative rather than limiting, and that it be understood that it is the following claims, including all equivalents, that are intended to define the spirit and scope of this invention.

The invention claimed is:

1. A method for timing analysis of a circuit, the circuit comprising a first circuit element and a second circuit element interconnected with the first circuit element, each of the first circuit element and the second circuit element operated with a particular respective clock mode as a function of a state of a change-over signal, the timing analysis carried out using a description of the circuit, the description of the circuit containing information as to whether the change-over signal is a quasi-static signal which does not change during operation of the circuit, a description for the first and second circuit elements each comprises information as to the state of a change-over signal with which the respective circuit element is operated in which clock mode, the method comprising:

performing, in the course of timing analysis of a timing path which comprising the first circuit and second circuit elements, a check as to whether the change-over signal is a quasi-static signal; and, if the change-over signal is a quasi-static signal, disregarding combinations of respective particular clock modes of the first and second circuit elements that require different pre-determined states of the change-over signal in the timing analysis.

2. The method according to claim 1, wherein at least one of the first and second circuit elements comprises a flip-flop or a latch.

3. The method according to claim 1, wherein the respective particular clock mode specifies a clock signal with which the respective circuit element is operated.

4. The method according to claim 1, wherein the change-over signal serves for changing over the circuit between a test mode and a normal operating mode.

5. The method according to claim 1, wherein: the change-over signal comprises a first change-over signal and a second change-over signal, the description comprises information as to which combinations of states of the first change-over signal and of states of the second change-over signal may arise in the course of operation of the circuit, the method further comprises the disregarding combinations of respective particular clock modes of the first circuit element and of the second circuit element that result only in the case of combinations of states of the first change-over signal and of the second change-over signal that cannot arise in the timing analysis of the timing path.

6. The method according to claim 1, wherein the process is carried out to analyze the timing response of a layout of the circuit.

7. A device for timing analysis of a circuit that includes interconnected first and second circuit elements, the first and second circuit elements each being operated with a particular respective clock mode as a function of a state of a change-over signal, the device comprising:

an analysis unit to which a description of the circuit is capable of being supplied, the analysis unit being configured such that the analysis unit carries out the timing analysis using the description, wherein the description comprises information as to whether the change-over signal is a quasi-static signal which does not change during operation of the circuit, descriptions for the first and second circuit elements each comprise information as to the state of change-over signal with which the respective circuit element is operated in which clock mode, and the analysis unit is configured such that in the course of the timing analysis of a timing path which comprises the first and second circuit element, the analysis unit checks whether the change-over signal is a quasistatic signal, and that, if the change-over signal is a quasi-static signal, in the timing analysis the analysis unit disregards combinations of respective particular clock modes of the first circuit element and of the second circuit element that require different predetermined states of the change-over signal.

8. The device according to claim 7, wherein at least one of the first and second circuit elements comprises a flip-flop or a latch.

9. The device according to claim 7, wherein the respective particular clock mode specifies a clock signal with which the respective circuit element is operated.

10. The device according to claim 7, wherein the change-over signal serves for changing over the circuit between a test mode and a normal operating mode.

11. The device according to claim 7, wherein change-over signal comprises first and second change-over signals, the description comprises information as to which combinations of states of the first change-over signal and of states of the second change-over signal may arise in the course of operation of the circuit, and the analysis unit is further designed such that the analysis unit disregards combinations of respective particular clock modes of the first circuit element and of the second circuit element that result only in the case of combinations of states of the first change-over signal and of the second change-over signal that cannot arise in the timing analysis of the timing path.

12. The device according to claim 7, wherein the device analyzes the timing response of a layout of the circuit.

13. A computer-program product with a program code which is set up such that in the course of execution of the program code in a data-processing system, a method for timing analysis of a circuit is implemented, the circuit comprising a first circuit element and a second circuit element interconnected with the first circuit element, each of the first circuit element and the second circuit element operated with a particular respective clock mode as a function of a state of a change-over signal, the timing analysis carried out using a description of the circuit, the description of the circuit containing information as to whether the change-over signal is a quasi-static signal which does not change during operation of the circuit, a description for the first and second circuit elements each contain information as to the state of a change-over signal with which the respective circuit element is operated in which clock mode, the method comprising:

performing, in the course of timing analysis of a timing path which comprises the first circuit and second circuit elements, a check as to whether the change-over signal is a quasi-static signal; and, if the change-over signal is a quasi-static signal, disregarding combinations of respective particular clock modes of the first and second circuit elements that require different predetermined states of the change-over signal in the timing analysis.

14. The computer-program product according to claim 13, wherein at least one of the first and second circuit elements comprises a flip-flop or a latch.

15. The computer-program product according to claim 13, wherein the respective particular clock mode specifies a clock signal with which the respective circuit element is operated.

16. The computer-program product according to claim 13, wherein the change-over signal serves for changing over the circuit between a test mode and a normal operating mode.

17. The computer-program product according to claim 13, wherein: the change-over signal comprises a first change-over signal and a second change-over signal, the description comprises information as to which combinations of states of the first change-over signal and of states of the second change-over signal may arise in the course of operation of the circuit, the method further comprises disregarding combinations of respective particular clock modes of the first circuit element and of the second circuit element that result only in the case of combinations of states of the first change-over signal and of the second change-over signal that cannot arise in the timing analysis of the timing path.

18. The computer-program product according to claim 13, wherein the process is carried out to analyze the timing response of a layout of the circuit.

* * * * *

UNITED STATES PATENT AND TRADEMARK OFFICE
CERTIFICATE OF CORRECTION

| | |
|---|---|
| PATENT NO. | : 7,237,213 B2 |
| APPLICATION NO. | : 10/996344 |
| DATED | : June 26, 2007 |
| INVENTOR(S) | : Andreas Küsel |

It is certified that error appears in the above-identified patent and that said Letters Patent is hereby corrected as shown below:

On the Title Page

Column 1, item (73), before "(DE)" insert --Munich--.

Column 1, line 1, under "Foreign Application Priority Data" after "103 55" delete "187" and substitute --187.5-- in its place.

In the Claims

Column 6, in claim 1, line 20, before "comprising the first circuit" delete "which".

Signed and Sealed this

Twenty-third Day of October, 2007

JON W. DUDAS
*Director of the United States Patent and Trademark Office*